US006704921B2

(12) United States Patent
Liu

(10) Patent No.: US 6,704,921 B2
(45) Date of Patent: Mar. 9, 2004

(54) AUTOMATED FLOW IN PSM PHASE ASSIGNMENT

(75) Inventor: Hua-Yu Liu, Palo Alto, CA (US)

(73) Assignee: Numerical Technologies, Inc., Mountain View, CA (US)

(*) Notice: Subject to any disclaimer, the term of this patent is extended or adjusted under 35 U.S.C. 154(b) by 0 days.

(21) Appl. No.: 10/116,660

(22) Filed: Apr. 3, 2002

(65) Prior Publication Data
US 2003/0192025 A1 Oct. 9, 2003

(51) Int. Cl.[7] .............................................. G06F 17/50
(52) U.S. Cl. .......................................... 716/19; 716/21
(58) Field of Search ........................ 716/19–21; 430/5

(56) References Cited

U.S. PATENT DOCUMENTS

| 5,302,477 A | 4/1994 | Dao et al. ........................ 430/5 |
| 5,308,741 A | 5/1994 | Kemp .......................... 430/312 |
| 5,324,600 A | 6/1994 | Jinbo et al. ...................... 430/5 |
| 5,364,716 A | 11/1994 | Nakagawa et al. ............. 430/5 |
| 5,472,814 A | 12/1995 | Lin ................................. 430/5 |
| 5,523,186 A | 6/1996 | Lin et al. ......................... 430/5 |
| 5,527,645 A | 6/1996 | Pati et al. ....................... 430/5 |
| 5,537,648 A | 7/1996 | Liebmann et al. ........... 395/500 |
| 5,538,815 A | 7/1996 | Oi et al. .......................... 430/5 |
| 5,565,286 A | 10/1996 | Lin ................................. 430/5 |
| 5,573,890 A | 11/1996 | Spence ....................... 430/311 |
| 5,595,843 A | 1/1997 | Dao ............................... 430/5 |

(List continued on next page.)

FOREIGN PATENT DOCUMENTS

| DE | 195 45 163 A1 | 6/1996 |
| EP | 0 653 679 A2 | 5/1995 |
| GB | 2333613 A | 7/1999 |
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Cooke, M., "OPC/PSM Designs For Poly Gate Layers", European Semiconductor, vol. 22, No. 7, pp. 57–59, Jul. 2000.

(List continued on next page.)

Primary Examiner—Matthew Smith
Assistant Examiner—Paul Dinh
(74) Attorney, Agent, or Firm—Bever, Hoffman & Harms, LLP; Jeanette S. Harms

(57) ABSTRACT

An automated phase assignment method is described that allows multiple rules for defining phase shifters to be used within a single cell. The rules for defining phase shifters can be sequenced. Then for a cell, the rules can be recursively applied. At each stage if the number of phase conflicts is below a threshold, then portions of the cell having conflicts are masked and processed using the next less aggressive rule set. This in turn leads to phase shifting masks with greater variation in phase shifter shapes and sizes. When the mask is used to fabricate integrated circuits (ICs), the resulting IC may have a greater number of small transistors and other features than a mask defined using only a single rule set per cell. Additional benefits can include better process latitude during IC fabrication and improved yield.

22 Claims, 10 Drawing Sheets

U.S. PATENT DOCUMENTS

| | | | |
|---|---|---|---|
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,416,907 B1 * | 7/2002 | Winder et al. | 430/5 |
| 6,420,074 B2 | 7/2002 | Wang et al. | 430/5 |
| 6,436,590 B2 | 8/2002 | Wang et al. | 430/5 |
| 6,543,045 B2 * | 4/2003 | Ludwig et al. | 716/21 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

OTHER PUBLICATIONS

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Ackmann, P., et al., "Phase Shifting and Optical Proximity Corrections to Improve CD Control on Logic Devices in Manufacturing for Sub 0.35um I–Line", SPIE, vol. 3051, pp. 146–153, Mar. 12–14, 1997.

Matsuoka, K., et al., "Application of Alternating Phase–Shifting Mask to 0.16um CMOS Logic Gate Patterns", Matsushita Electric Ind. Co., Ltd. (9 pages).

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1 Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Rosenbluth, A., et al., "Optimum Mask and Source Patterns to Print a Given Shape", IBM (17 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

Terasawa, T., et al., "0.3–Micron Optical Lithography Using a Phase–Shifting Mask", SPIE, Optical/Laser Microlithography II, vol. 1088, pp. 25–33, Mar. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE. 10th Annual Symposium On Microlithography, vol. 1496, pp. 80–85 (1990).

Yamanaka, T., et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investing Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Symposium On VLSI Technology Digest Of Technical Papers, pp. 112–113 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithographic Image Quality", IEEE, pp. 3.3.1–3.3.4 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34. No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys., vol. 32, Pt. 1 No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5897, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (RPOPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Ohnuma, II., et al., "Lithography Computer Aided Design Technology for Embedded Memory in Logic", Jpn. J. Appl. Phys., vol. 37, Part I, No. 12B, pp. 6686–6688, Dec. 1998.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, Dec. 4–13, 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt–PSMs", Optical Microlithography XIII, Proceeding of SPIE, vol. 4000, pp. 121–131 (2000).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Shift Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Liebmann, L.W., et al., "TCAD Development For Lithography Resolution Enhancement", IBM J. Res. & Dev., vol. 45, No. 5, pp. 651–665, Sep. 5, 2001.

Anonymous, "PSMLint—Phase Shifting Mask Physical Verification Level Type Checking", IPCOM000007351D, Mar. 18, 2002 (9 pages).

Liebmann, L., et al., "Enabling Alternating Phase Shifted Mask Designs For A Full Logic Gate Level", J. Microlith., Microfab., Microsyst., vol. 1, No. 1, pp. 31–42, Apr. 2002.

* cited by examiner

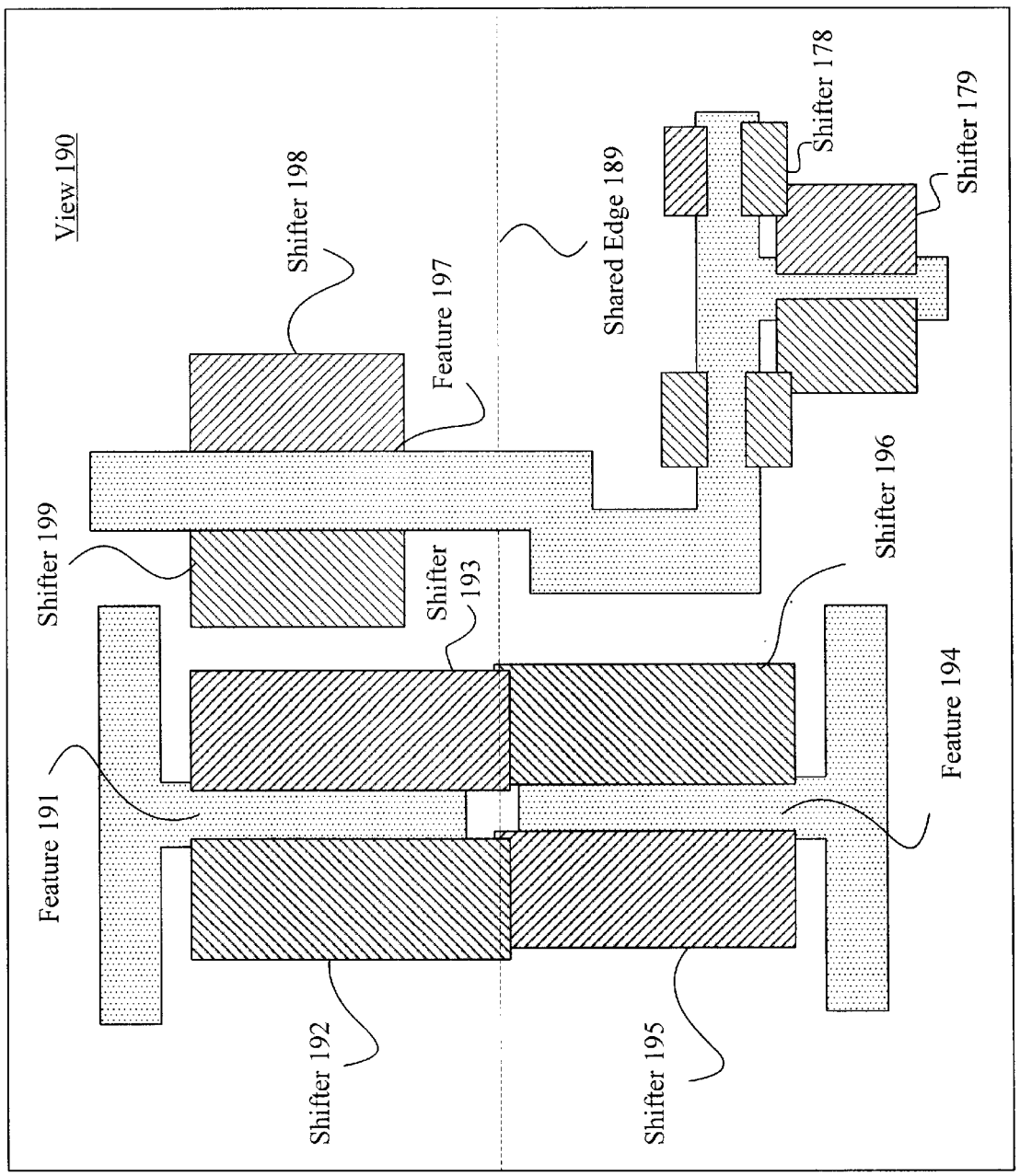

AUTOMATED FLOW IN PSM PHASE ASSIGNMENT

BACKGROUND OF THE INVENTION

1. Field of the Invention

The invention relates to a phase shifting mask (PSM) process, and particularly to an automated flow in PSM phase assignment.

2. Description of the Related Art

In designing an integrated circuit (IC), engineers typically rely upon computer-implemented tools to help create a circuit schematic design consisting of individual devices coupled together to perform a certain function. To fabricate this circuit in a semiconductor substrate on a wafer, the circuit must be translated into a physical representation, called a layout. Computer-aided design (CAD) tools can assist layout designers in the task of translating the discrete circuit elements into geometric shapes (called features) on the layout. After this translation, the layout (or portions thereof) can be transferred onto a physical template, i.e. a mask/reticle.

A mask (usually a quartz plate coated with chrome) is generally created for each layer of the IC design. In less complicated and dense ICs, each mask comprises the features that represent the desired circuit pattern for its corresponding layer. In more complicated and dense ICs in which the size of the features approach the optical limits of the lithography process, the masks may also comprise sub-wavelength, optical proximity correction (OPC) structures, such as serifs, hammerheads, bias and assist bars, which are designed to compensate for proximity effects.

These masks are then used to project their patterns onto the wafer coated with photoresist material. For each layer of the design, a light (visible/non-visible radiation) is shone on the mask corresponding to that layer. This light passes through the clear regions of the mask, whose image exposes the underlying photoresist layer, and is blocked by the opaque regions of the mask, thereby leaving that underlying portion of the photoresist layer unexposed. The exposed photoresist layer is then developed, typically through chemical removal of the exposed/non-exposed regions of the photoresist layer. The result is a wafer coated with a photoresist layer exhibiting the desired pattern, which defines the features of that layer. This lithographic process is then repeated for each layer of the design.

One advance in lithography called phase shifting is able to generate features on the wafer that are smaller than the corresponding wavelength of the light. These ultra-small features are generated by the destructive interference of light in adjacent, complementary pairs of phase shifters having opposite phase, e.g. 0 and 180 degrees. In one embodiment, the phase shifters can be formed on a phase shifting mask (PSM), which is used in conjunction with a binary mask including the above-described features of the layout. In the PSM, complementary phase shifters (hereinafter referred to as shifters) are configured such that the exposure radiation transmitted by one shifter is 180 degrees out of phase with the exposure radiation transmitted by the other shifter. Therefore, rather than constructively interfering and merging into a single image, the projected images destructively interfere where their edges overlap, thereby creating a clear and very small image between the phase shifters.

FIG. 1A illustrates a view 190 of one portion of a phase shifting mask (PSM) superimposed on a corresponding portion of a layout. The layout includes three features 191, 194, and 197, wherein each feature could implement a gate of a transistor. Shifters 192 and 193 are associated with feature 191, shifters 195 and 196 are associated with feature 194, and shifters 198 and 199 are associated with feature 197. Note that these shifters can be light transmissive areas on an otherwise opaque PSM mask (assuming a dark field mask)(and noting that the opaque portion is not shown so as not to obscure features 191, 194, and 197).

Without shifters 192, 193, 195, 196, 198, and 199, the projection of features 191, 194, and 197 onto the wafer would be limited by the resolution of the optical process. However, if the light of a single wavelength passing through one of the shifters, e.g. shifter 192, is out of phase (by 180 degrees or n radians) with the light of the same wavelength passing through the other shifter, e.g. shifter 193, then an interference pattern is set up on the wafer. (For ease of reference, shifters of a different phase are indicated with a different fill pattern.) This interference generates a printed feature having a width that is less than the width that could be achieved using only feature 191 on a binary mask.

A phase conflict can exist if two shifters have an undesirable lithographic result. For example, in view 190, shifters 192 and 195 could create a printed feature on the wafer where no feature is desired; however, the printed feature may be acceptable if it can be removed by a second exposure. Shifter pairs 193/196 and 193/199 could produce similar, undesirable printing results, which cannot be removed because the conflict requires the same location on the phase shifting mask to have two different phases. Similarly, the phase conflict caused by shifters 178 and 179 cannot be resolved using current phase shifter design rules. Therefore, those phase shifters could be removed from the PSM. In some instances, a more efficient and cost-effective process for production environments would eliminate the phase conflicts themselves.

Currently, tools for assigning phase to shifters analyze the layout using cells. For example, view 190 shows a shared edge 189 between one cell including feature 191 and its associated shifters 192/193 and a portion of feature 197 and its associated shifters 198/199 and another cell including feature 194 and its associated shifters 195/196 and a portion of feature 197. Note that the term "cell" can have various meanings. For example, a cell can refer to shapes or portions thereof in a layout that fall within an analysis pattern used by the tool. FIG. 1B illustrates one analysis pattern, i.e. a grid of uniform squares, which defines cells 151–159. In another embodiment, the analysis pattern can define non-uniform cells. For example, FIG. 1C illustrates another analysis pattern that defines non-uniform cells 161–166. In yet another embodiment, a cell can be defined by a predetermined set of shapes (features, shifters, etc.) that are associated with one or multiple layers.

Shapes within a cell are treated with one rule set, wherein the rule set includes sizing and positioning of the shapes. FIG. 1D illustrates a simplified layout for a transistor including a gate 185 (which could be defined by a binary mask), a diffusion area 186 (which could be defined by an n-well mask), and shifters 183 and 184 (which could be defined by a PSM). Exemplary parameters in a rule set for this layout could include an endcap margin 181 (measured from an edge of diffusion area 186 to the end of gate 185), a fieldcap margin 182 (measured from an opposite edge of diffusion area 186 to a line connected to gate 185), and a shifter width 187. Other parameters could, for example, shifter length and a minimum spacing between shifters.

Selecting the value of the parameters can significantly change the resolution of the printed features defined by the cell. For example, wide shifters provide better printing resolution than narrow shifters. Additionally, large endcap and fieldcap margins provide better printing resolution than small endcap and fieldcap margins. A rule set including parameter values that can provide better lithographic performance is considered "more aggressive" than a rule set including parameter values that can provide less optimal lithographic performance. Therefore, to optimize printing resolution, the most aggressive rule set possible should used for each cell in the layout.

Unfortunately, using an aggressive rule set to optimize printing resolution can generate more phase conflicts than if a less aggressive rule set is used. In a layout with many cells, wherein each cell includes hundreds or even tens of thousands of features, the probability of phase conflict using an aggressive rule set is high.

Automated tools that assign, i.e. size and place, shifters for a layout attempt to provide optimal printing resolution and eliminate phase conflicts. However, cell-by-cell methodologies automatically resort to a less aggressive rule set for an entire cell even if only a single phase conflict is created with a more aggressive rule set.

For example, FIG. 1E illustrates a cell-by-cell methodology for assigning a rule set to each cell. Step 101 determines whether all cells in the layout have been phase shifted. If not, then step 102 attempts to phase shift the next cell with the most aggressive rule set, i.e. the $1^{st}$ rule set. Step 103 determines whether a phase conflict would be created using the $1^{st}$ rule set. If not, then that cell is phase shifted using the $1^{st}$ rule set in step 104 and the process returns to step 101. If a phase conflict is created using the $1^{st}$ rule set, then step 105 attempts to phase shift the cell with a less aggressive rule set, i.e. the $2^{nd}$ rule set. Step 106 determines whether a phase conflict would be created using the $2^{nd}$ rule set. If not, then that cell is phase shifted using the $2^{nd}$ rule set in step 107 and the process returns to step 101.

If a phase conflict is still created using the $2^{nd}$ rule set, than consecutively less aggressive rule sets are used until the process reaches the last rule set. Specifically, step 108 attempts to phase shift the cell with the last rule set. Step 109 determines whether a phase conflict would be created using the last rule set. If not, then that cell is phase shifted using the last rule set in step 110 and the process returns to step 101.

If at least one phase conflict is still created using the last rule set, then the tool implementing the process can notify the user that phase assignment using the existing rule sets was unsuccessful in step 111. At this point, the user can manually modify the layout to resolve the remaining phase shift conflict(s). However, this manual modification is extremely time consuming as well as tedious, thereby making it highly undesirable in the production environment.

Note that even if all cells have been phase shifted successfully, as determined in step 101, a phase conflict between cells may still exist. At this point, a process 112 similar to steps 102–111 can be followed to resolve any inter-cell phase conflicts. In other words, if a phase conflict exists between two adjacent cells, then one of the two cells is phase shifted with the next lower rule set until that phase conflict is resolved. In one embodiment, the process can begin with the cell with the higher rule set, assuming that the cells have been phase shifted with different rule sets. In another embodiment, one of the two cells is arbitrarily chosen to be phase shifted with the lower rule set.

Because even a single phase conflict in a cell can result in a lower rule set being applied to that cell, the most aggressive rule sets are rarely applied in many designs. It logically follows, correspondingly, that the best printing resolution for such designs can rarely be achieved. Therefore, a need arises for a system and method of applying aggressive rule sets more frequently, thereby improving lithographic performance.

SUMMARY OF THE INVENTION

In accordance with one aspect of the invention, fully automated phase assignment of an integrated circuit layout can be provided in a production environment. Regions of a cell in the layout can be analyzed and phase shifted independently from other regions of the cell, thereby allowing more features to benefit from fabrication using phase shifters defined according to more aggressive rule sets. In this manner, the printing resolution of many features can be significantly improved.

In one embodiment, a method of applying rule sets to a layout can include dividing the layout into a plurality of cells and allowing the use of multiple rule sets within a cell. A number, such as the number of phase conflicts in a cell or the percentage of phase conflicts (i.e. the number of phase conflicts in the cell divided by a total number of features in the cell), can be determined by a program, guidelines, and/or a user. This number can then be compared to a predetermined limit, wherein the predetermined limit indicates a maximum permissible number of phase conflicts that can exist in a cell before another less aggressive rule set is used for the cell.

If the number is less than or equal to the predetermined limit, then any area of phase conflict can be masked. At this point, the rest of the cell, e.g. the unmasked portion, can be phase shifted using the most aggressive rule set. An attempt can then be made to apply a less aggressive rule set to the masked areas.

If no phase conflict occurs using the less aggressive rule set, then the masked areas can be phase shifted using that less aggressive rule set. If at least one phase conflict occurs, then consecutively less aggressive rule sets can be tried, until the number of phase conflicts is less than or equal to a predetermined limit. Note that each rule set can have an associated predetermined limit. Then, the non-phase conflict areas can be phase shifted with the current rule set. The process repeats attempting to phase shift the remaining phase conflict areas with the next lower (i.e. less aggressive) rule set. This process can be repeated for each cell.

Advantageously, this method can significantly reduce the area of analysis for each rule set. Thus, the most aggressive rule set(s) possible can be used for each analyzed area. Moreover, because multiple areas of each cell can be analyzed, more aggressive rule sets can be used more frequently for phase assignment in the layout. In this manner, lithographic performance can be significantly improved compared to methodologies that can only apply one rule set to a cell.

Inter-cell phase conflicts can be resolved by analyzing an area associated with the shared edge between the cells. In one embodiment, an area encompassing both cells can be analyzed. In another embodiment, an area in only one cell can be analyzed. The method of determining the number of phase conflicts and comparing that number to a predetermined limit can be used in either embodiment.

A mask fabricated using this methodology can include different endcap margins, fieldcap margins, or shifter widths within a single predefined (e.g. rectangular) area of the mask. A wafer fabricated with a mask exhibiting such varied parameters could include transistor gates having different endcap margins, fieldcap margins, and lengths, all gates being within an area of the wafer corresponding to the predefined area of the mask. A wafer fabricated with this mask exhibits enhanced lithographic performance. Specifically, allowing the application of multiple rule sets in a cell of the layout can optimize the resolution of the printed features on the wafer defined by that cell. Obtaining the best possible resolution for the printed features can provide a corresponding improvement in yield and process latitude for the wafer.

A system for providing phase assignment can include a computer and a tool running on the computer. The tool can include means for dividing the layout into a plurality of cells and means for automatically applying rule sets to any cell.

A computer program product can include a computer usable medium having a computer readable program code embodied therein for causing a computer to automatically modify a layout including phase assignment. The computer readable program code includes computer readable program code that can assign multiple rule sets to each cell, if appropriate, in the layout.

BRIEF DESCRIPTION OF THE FIGURES

FIG. 1A illustrates a simplified layout including a plurality of features with their associated shifters, wherein phase conflicts exist in both intra-cell and inter-cell regions of the layout.

DETAILED DESCRIPTION OF THE FIGURES

FIGS. 2A–2D illustrate a methodology 200 in which different rule sets can be applied to different regions of a single cell, thereby advantageously allowing more aggressive rule sets to be used more frequently. In methodology 200, a process can receive user input and/or include default settings in step 201. The user input can include, for example, layout and parameter information. Parameter information (explained in further detail in reference to FIGS. 3A, 3B, and 4) can include, for example, shifter widths, endcap margins, and fieldcap margins associated with each rule set. In one embodiment where user input is not provided, default parameter settings can be provided automatically by a system.

If all cells have not been phase shifted, as determined in step 202, then step 203 attempts to phase shift the next cell with the $1^{st}$ rule set (i.e. the most aggressive rule set). If using the $1^{st}$ rule set does not cause a phase conflict, as determined in step 204, then the cell can be phase shifted with the $1^{st}$ rule set in step 205 and the process can return to step 202. However, if a phase conflict does arise as a result of the $1^{st}$ rule set, then step 206 determines whether the number/percentage of phase conflicts is greater than a first limit X(1). The number of phase conflicts can be calculated by counting the phase conflicts within the cell. The percentage of phase conflicts can be calculated by dividing the number of phase conflicts in a cell by the total number of features that can be defined using phase shifting in that cell. Note that methodology 200 is equally applicable to numbers or percentages. For ease of reference, the term "number" will be used for purposes of describing the limit X(n) in FIGS. 2A–2D and will mean either the number or percentage of phase conflicts.

If the number of phase conflicts is less than the first limit X(1), then any area with a phase conflict is masked in step 207 and the remainder of the cell can be phase shifted with the $1^{st}$ rule set in step 208. Step 209 attempts to phase shift the masked areas with a $2^{nd}$ rule set (i.e. a rule set less aggressive than the $1^{st}$ rule set). Note that if the number of phase conflicts is more than the first limit X(1), then step 210 attempts to phase shift the whole cell with the $2^{nd}$ rule. Following either step 209 or 210, step 211 determines whether any phase conflicts are present.

Figure 2A:
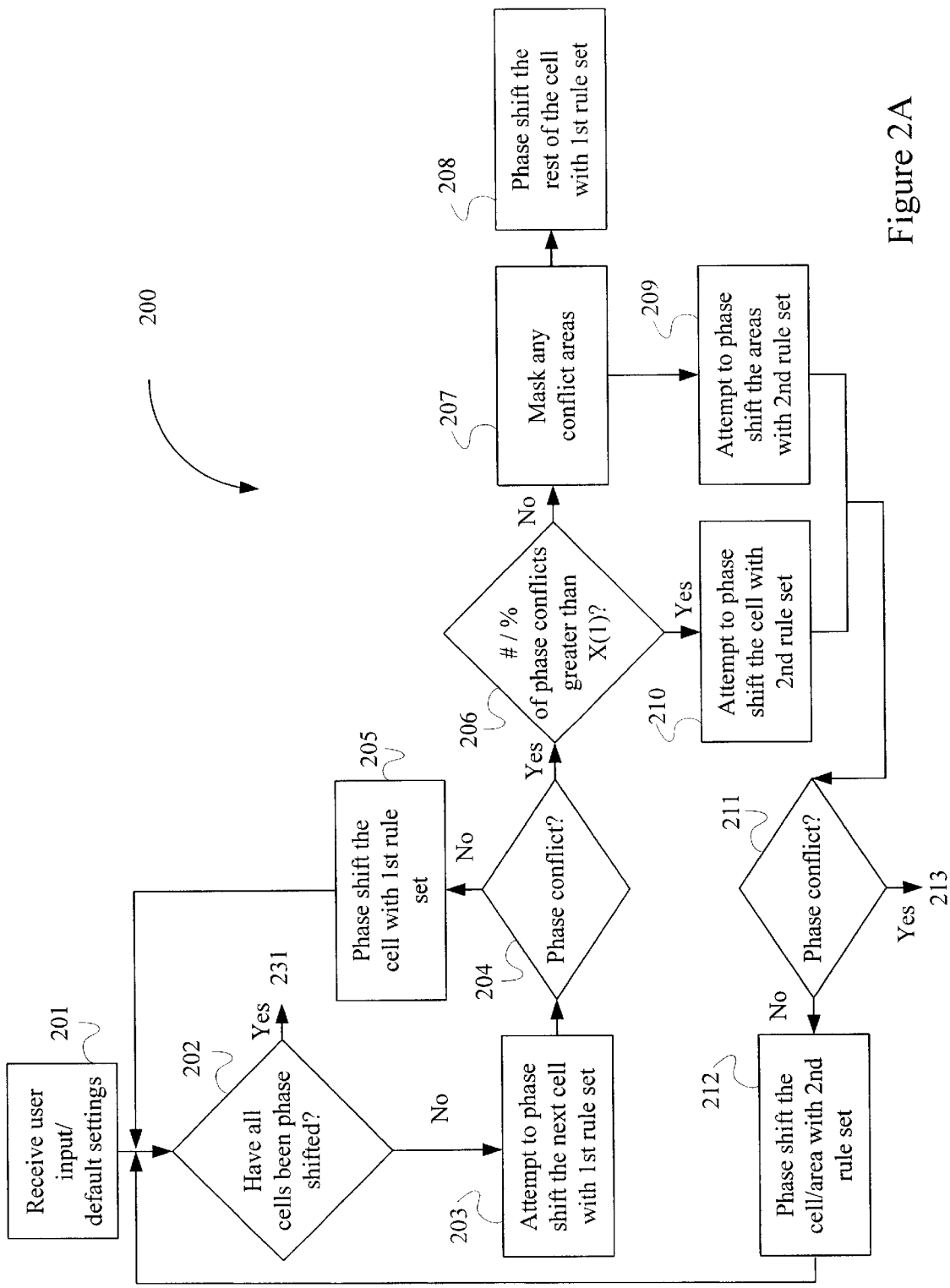
FIGS. 2A–2D illustrate a methodology in which the number/percentage of phase conflicts in a cell can be determined, thereby allowing regions of the cell to be treated with a more aggressive rule set.
Figure 2B:
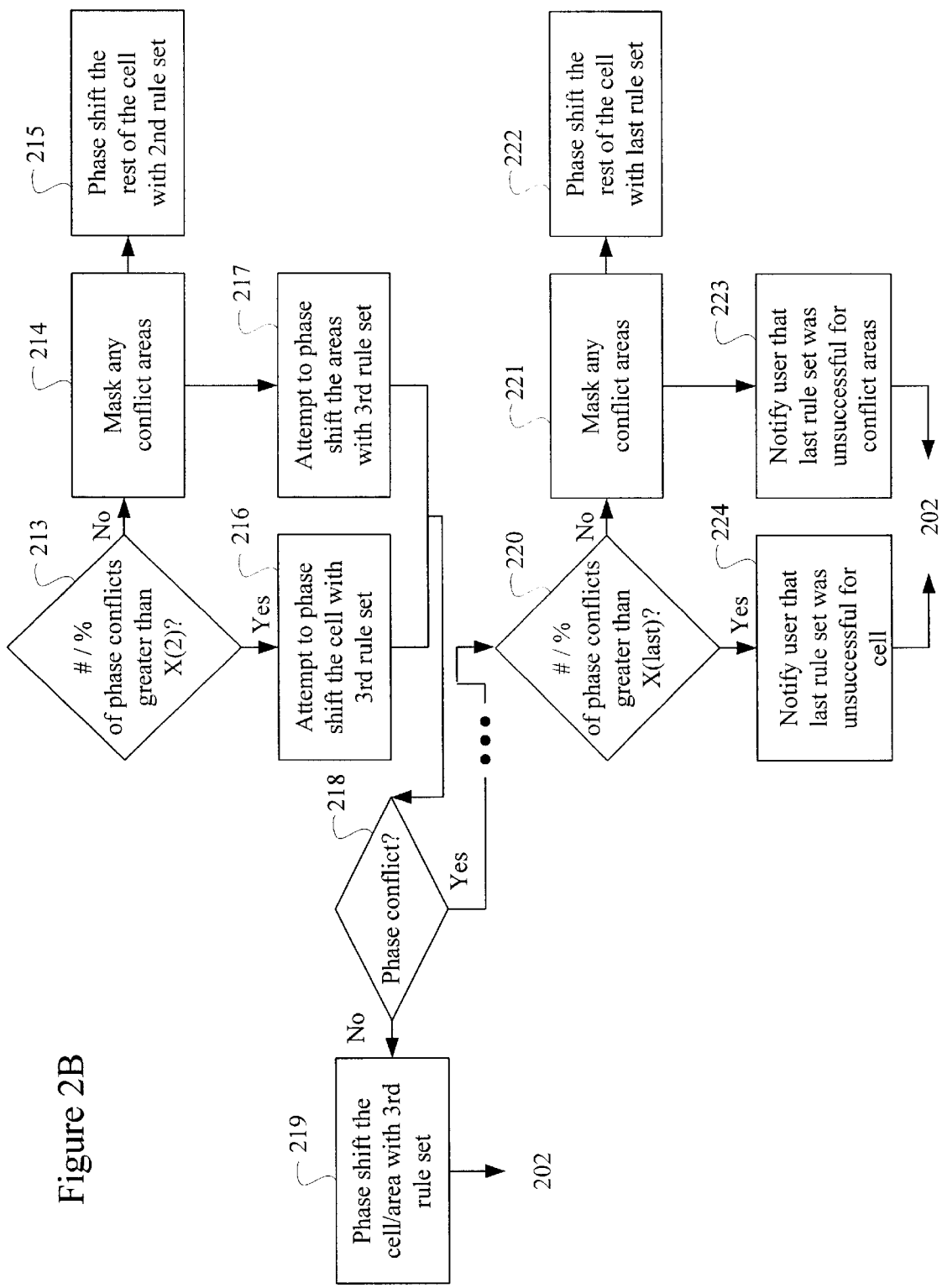

If no phase conflicts are present (either in the masked area(s) if following step 209 or in the cell if following step 210), then step 212 phase shifts the masked area(s) or cell with the $2^{nd}$ rule set. If phase conflicts are present, then the process proceeds to step 213 (FIG. 2B).

In accordance with one feature of the invention, each stage of the process involving a specific rule set can use a predetermined limit to determine whether masking is appropriate. This predetermined limit can be different than or the same as another predetermined limit. For example, in this stage of the process, if the number of phase conflicts is less than a second limit X(2), as determined in step 213, then any area with a phase conflict is masked in step 214 and the remainder of the cell can be phase shifted with the $2^{nd}$ rule set in step 215. Step 217 attempts to phase shift the masked areas with the $3^{rd}$ rule set (i.e. a rule set less aggressive than the $2^{nd}$ rule set). Note that if the number of phase conflicts is more than the second limit X(2), then step 216 attempts to phase shift the whole cell with a $3^{rd}$ rule set in step 216. Following either step 217 or 216, step 218 determines whether any phase conflicts are present.

If no phase conflicts are present (either in the masked area(s) if following step 217 or in the cell if following step 216), then step 219 phase shifts the masked area(s) or cell with the $3^{rd}$ rule set in step 219. If phase conflicts are present, then the process proceeds to consecutive stages of the process, as necessary, wherein each stage uses a less aggressive rule set than the proceeding stage.

The last stage of the process, i.e. steps 220–224, determine whether any remaining phase conflicts can be resolved using the least aggressive rule set. Specifically, in step 220, the process can determine whether the number of phase conflicts is greater than a predetermined limit X(last). If not, step 221 can mask any areas of phase conflict and step 222 can phase shift non-phase conflict areas of the cell with the last rule set. Step 223 can notify the user that the last rule set was unsuccessful for designated cell areas. If the number of phase conflicts is greater than the predetermined limit X(last), then step 224 can notify the user that the last rule set was unsuccessful for the whole cell. Upon receiving such notification, the user can manually modify the design to resolve the phase shift conflict, add additional parameter sets, manually define the phase shifters, and/or change other phase assignments. After one of steps 223 and 224, the tool can return to step 202 for phase shifting of the next cell.

Note that in accordance with one feature of the invention, masking allows significant regions of the cell to be phase shifted using the most aggressive rule set possible. Moreover, each stage of the process can allow portions of the previously masked areas to be treated separately. In other words, the areas being considered for a less aggressive rule set can significantly decrease at each stage. Thus, the number of areas being considered for the last rule set during the last stage of the process (i.e. steps 220–224) can be dramatically less than the number of areas being considered for the second rule set during the second stage of the process (i.e. 213–217). In this manner, the process can advantageously use the most aggressive rule set for as many regions of the layout as possible while remaining computationally efficient.

Figure 2C:
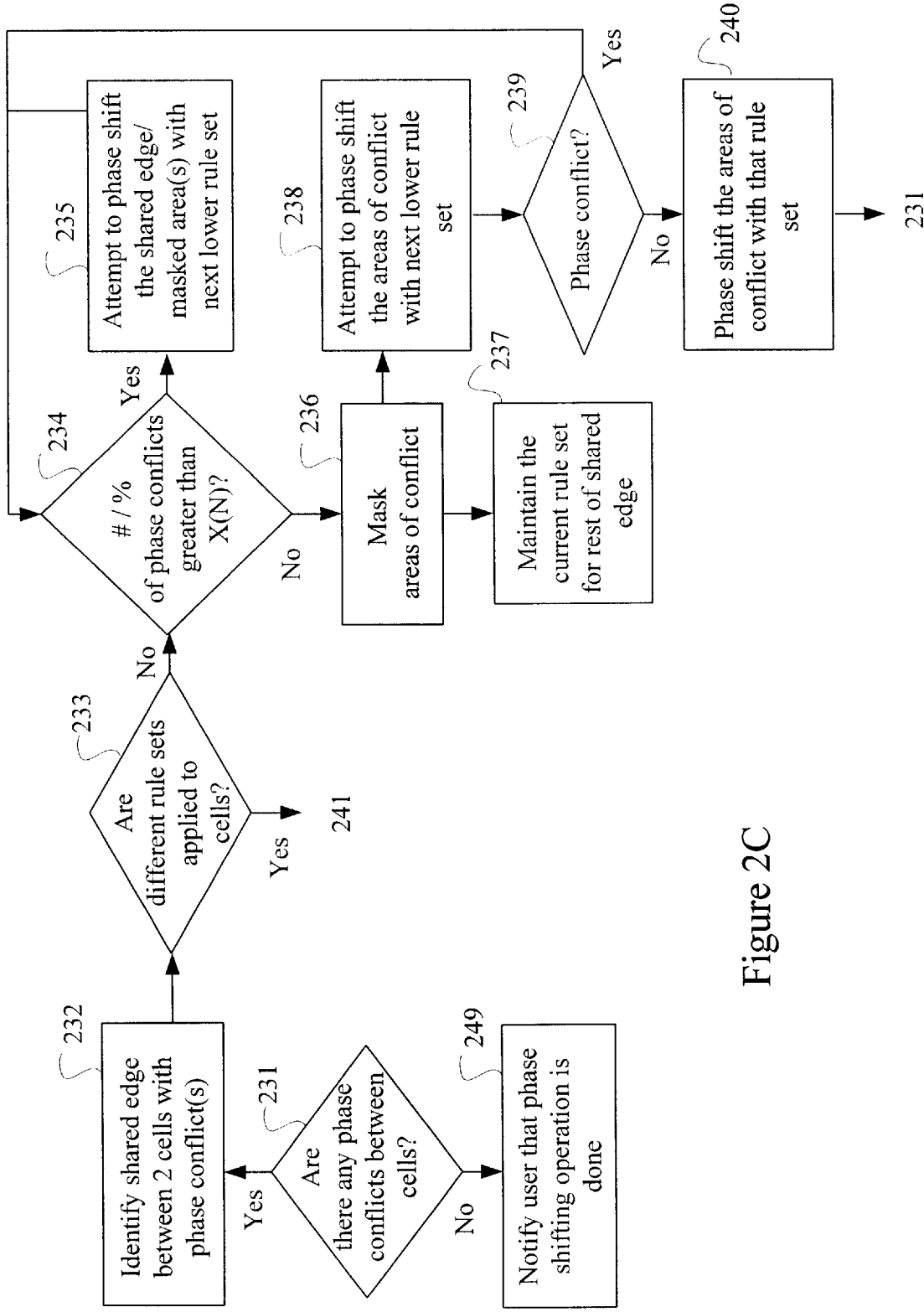
Figure 2D:
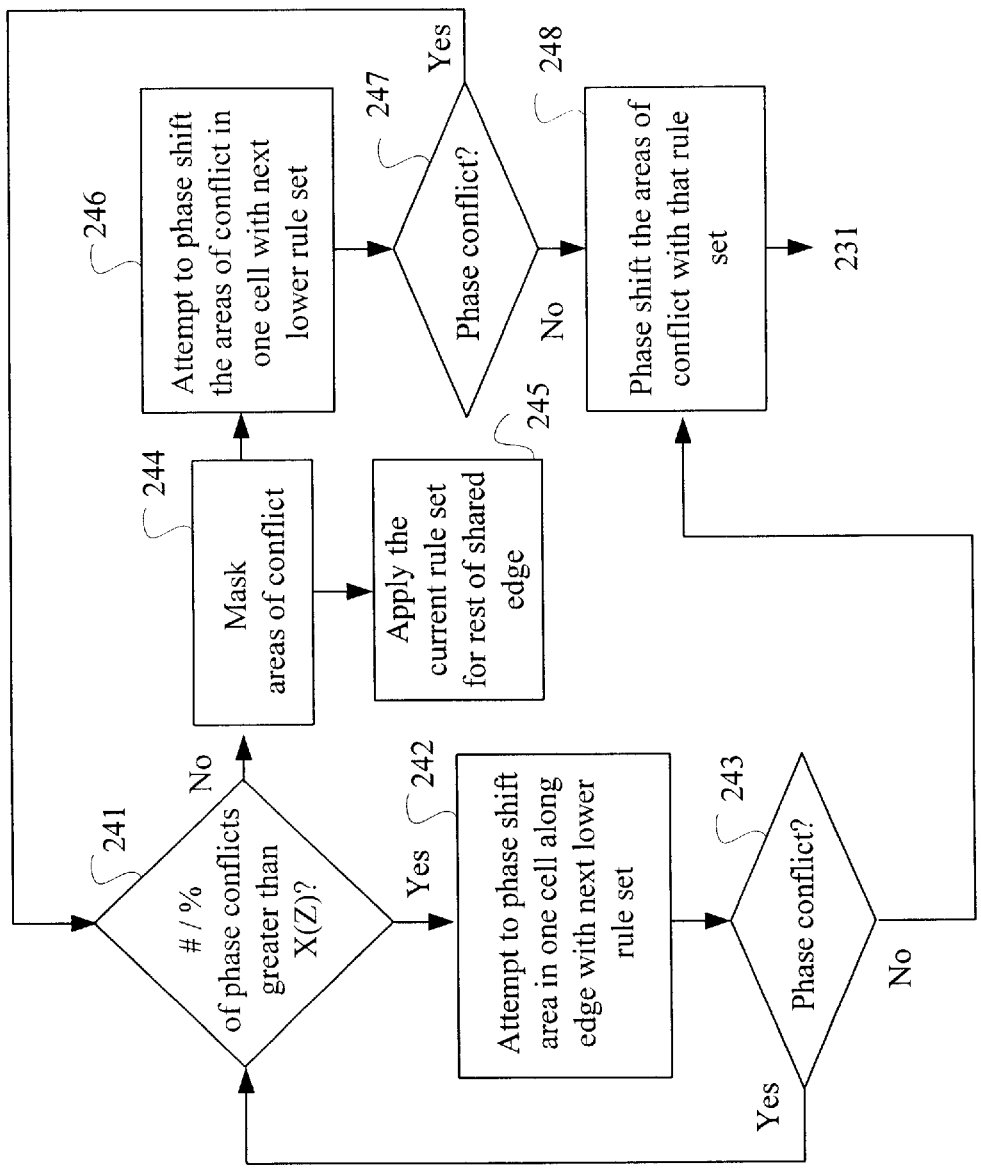

After all cells have been phase shifted, as determined in step 202 (FIG. 2A), inter-cell phase conflicts can be addressed as shown in FIGS. 2C–2D. Specifically, step 231 determines whether any phase conflicts exist between cells. If no conflicts are present, then step 249 can notify the user that the phase shifting operation is complete. If at least one inter-cell phase conflict is present, then step 232 can identify the shared edge with the phase conflict(s) between the two cells.

Inter-cell phase conflicts can be resolved by addressing areas adjacent the shared edge in both cells or by addressing areas adjacent the shared edge in one cell. Thus, in one embodiment, step 233 determines whether different rule sets are applied to the two cells. In one embodiment, if the same rule set is applied to both cells, then the inter-cell phase conflicts can be resolved by modifying the rule set in areas adjacent the shared edge in both cells. Specifically, if the same rule set has been applied to both of the cells, then step 234 determines whether the number of phase conflicts in areas adjacent the shared edge is greater than a limit X(N). (Note that limit X(N) can vary from one rule set to another. For example, the $1^{st}$ rule set can have a lower limit X(N) than the $3^{rd}$ rule set, thereby increasing the areas of a shared edge that can be phase shifted with the most aggressive rule set possible for the two cells.)

If the number of phase conflicts in areas adjacent the shared edge is greater than a limit X(N), then step 235 attempts to phase shift an area encompassing the shared edge with the next lower rule set. Steps 234 and 235 can be repeated until the number of phase conflicts is less than or equal to limit X(N), at which point the areas of phase conflict can be masked in step 236 and the current rule set can be applied to the rest of the shared edge area in step 237. Step 238 attempts to phase shift the areas of phase conflict with the next lower rule set. Note that each such area of phase conflict can be treated independently, thereby ensuring that the most aggressive rule set possible can be used for each portion of the shared edge. If a phase conflict is still present, as determined step 239, then the process can repeat steps 234–239. (Note that in step 235, instead of attempting to phase shift the entire shared edge, the masked area is phase shifted with the next lower rule set.) If no phase conflict is present, then step 240 phase shifts the areas of conflict with the rule set used in step 238 and the process returns to step 231.

Figures 1B, 1C, 1D:
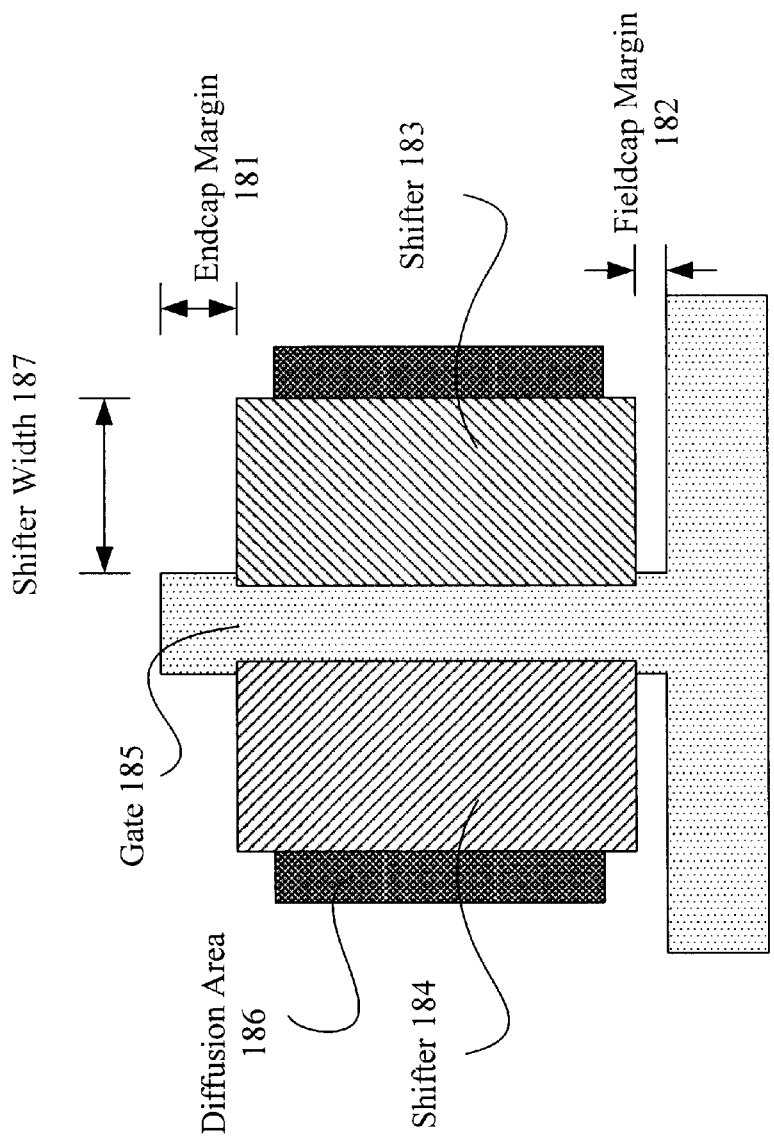
FIG. 1B illustrates one analysis pattern, i.e. a grid of uniform squares, which defines a plurality of cells.
FIG. 1C illustrates another analysis pattern that defines a plurality of non-uniform cells.
FIG. 1D illustrates exemplary parameters for a rule set including shifter width, endcap margin, and fieldcap margin.
Figure 1E:
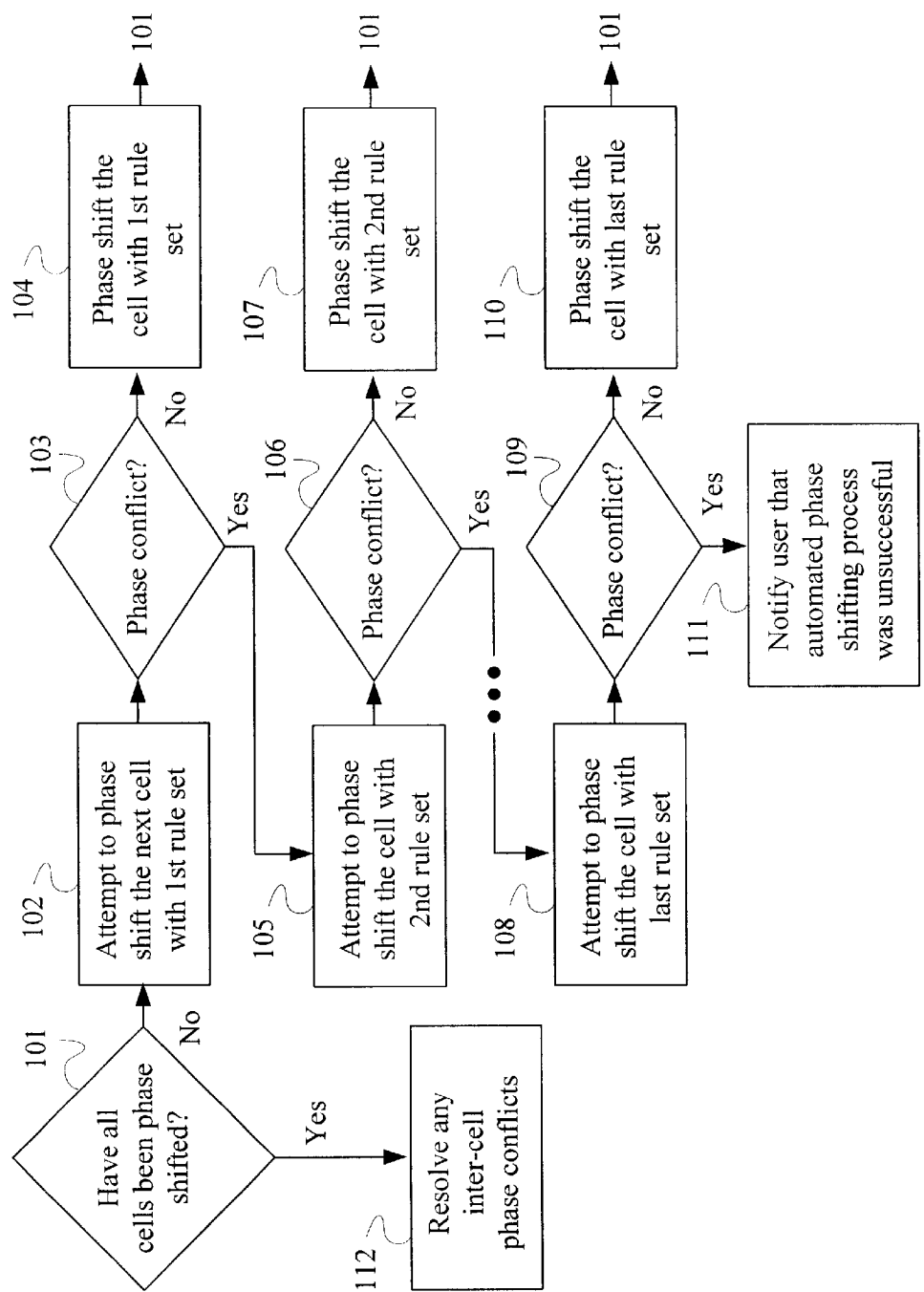
FIG. 1E illustrates a methodology in which cells are analyzed for phase conflict, wherein any phase conflict in the cell results in a less aggressive rule set being applied to the cell and any phase conflict between cells results in a less aggressive rule set being applied to one of the two cells.
Figure 2E:
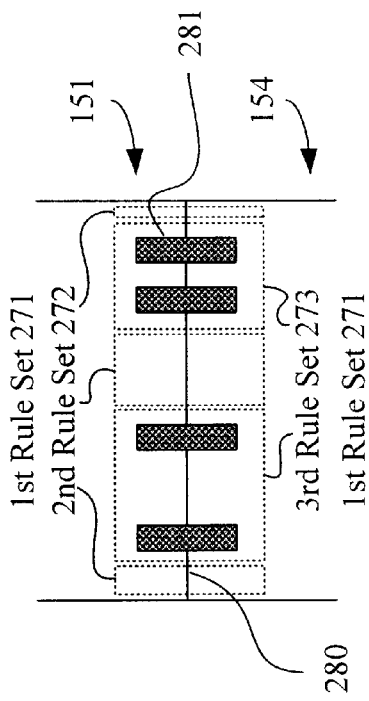
FIGS. 2E and 2F illustrate a plurality of inter-cell phase conflicts, wherein regions in both cells near the shared edge can be modified to another rule set.

FIG. 2E illustrates two adjacent cells 151 and 154 (see the layout of FIG. 1B), wherein the same rule set, i.e. $1^{st}$ rule set 271, has been applied to both cells 151 and 154. However, applying the $1^{st}$ rule set in both cells 151 and 154 has resulted in a number of areas with inter-cell phase conflicts 281 (denoted by shaded rectangles and not shown in detail) at a shared edge 280. Assuming that the number of inter-cell phase conflicts 281 is greater than limit X(N), consecutively less aggressive rule sets are attempted in an area 282 that includes inter-cell phase conflicts 281 until a rule set results in the number of phase conflicts being less than or equal to limit X(N).

Figure 2F:
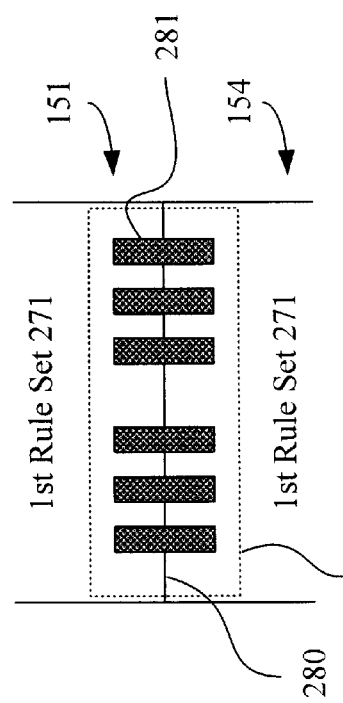

Assuming that phase shifting area 282 with the $2^{nd}$ rule set results in the number of phase conflicts being less than or equal to limit X(N), FIG. 2F illustrates that the non-phase conflict portions of area 282 can be phase shifted with the $2^{nd}$ rule set 272. An attempt can be made to apply $3^{rd}$ rule set 273 to the phase conflict portions of area 282. If phase conflicts 281 are eliminated using $3^{rd}$ rule set 273, then that rule set can be used for those phase conflicts areas. If phase conflicts 281 are still present using $3^{rd}$ rule set 273, then each phase conflict area can be treated independently (two conflict areas shown, each conflict area having two phase conflicts). Thus, one phase conflict area could be phase shifted with a $4^{th}$ rule set and the other phase conflict area could be phase shifted with a $5^{th}$ rule set, for example. Note that other portions of cells 151 and 154, i.e. those portions excluding area 282, remain phase shifted using $1^{st}$ rule set 271.

Because the number of phase conflicts can be significantly reduced each time areas of phase conflict are masked in step 236, the probability that a given plurality of rule sets cannot resolve all phase conflicts is very low.

Referring back to step 233, if different rule sets are applied to the two cells, then the inter-cell phase conflicts can be resolved by modifying the rule set in areas adjacent the shared edge in one cell. Step 241 first determines whether the number of inter-cell phase conflicts at the shared edge is greater than a predetermined limit X(Z) (Note that predetermined limit X(Z) could be the same or different than predetermined limit X(N)). If so, then step 242 attempts to phase shift an area adjacent the shared edge, but only in one cell. In one embodiment, the area associated with the more aggressive rule set is selected. If a phase conflict is not created, as determined in step 243, then the area adjacent the shared edge can be phase shifted with that rule set in step 248 and the process can return to step 231. However, if no phase conflict is created, then the process returns instead to step 241. Steps 241–243 can be repeated until the number of inter-cell phase conflicts is less than or equal to limit X(Z). At this point, the areas of phase conflict can be masked in step 244.

Step 245 applies the current rule set (i.e. the rule set last used in step 247) to any non-phase conflict areas adjacent the shared edge 285. Step 246 attempts to phase shift any phase conflict areas with the next lower rule set. If phase conflicts are resolved, as determined in step 247, then step 248 phase shifts those areas with that rule set and the process returns to step 231. If phase conflicts are not resolved, then the process returns to step 241. Steps 241–248 can be repeated until all phase conflicts are resolved.

Figure 2G:
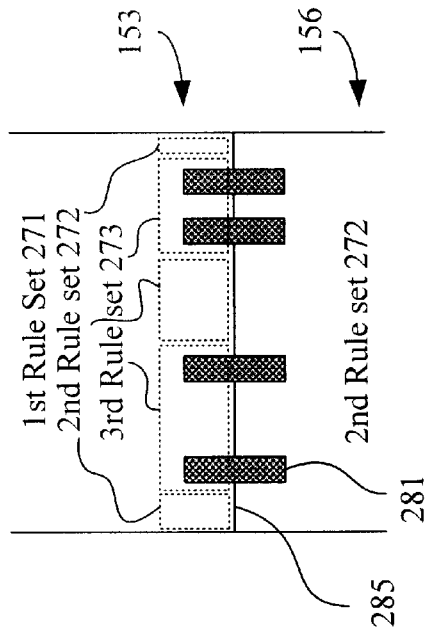
FIGS. 2G and 2H illustrate a plurality of inter-cell phase conflicts, wherein regions in one cell near the shared edge can be modified to another rule set.

For example, FIG. 2G illustrates two adjacent cells 153 and 156 (see the layout of FIG. 1B), wherein different rule sets, i.e. $1^{st}$ rule set 271 and $2^{nd}$ rule set 272, have been applied to cells 153 and 156. However, applying the $1^{st}$ and $2^{nd}$ rule sets in cells 153 and 156 has resulted in a number of inter-cell phase conflicts 281 at their shared edge 285. Assuming that the number of phase conflicts at shared edge 285 is greater than a predetermined limit X(Z), then an attempt can be made to phase shift an area 286 in cell 153 (e.g. the cell with the higher applied rule set) with the next lower rule set (in this case, $2^{nd}$ rule set 272). If phase conflicts are resolved by applying $2^{nd}$ rule set 272 to area 286, then area 286 can be phase shifted with that rule set and the process can determine if other inter-cell phase conflicts exist. However, if a phase conflict still exists, then consecutively lower rule sets can be applied until the number of inter-cell phase conflicts 281 is less than or equal to limit X(Z). At this point, the areas of phase conflict can be masked. (Note that if this approach fails to reduce the number of inter-cell phase conflicts 281 to less than or equal to limit X(Z), then the $2^{nd}$ rule set 272 can be applied to area 286 and the previous approach, described in reference to FIGS. 2E and 2F, can be used.)

Figure 2H:
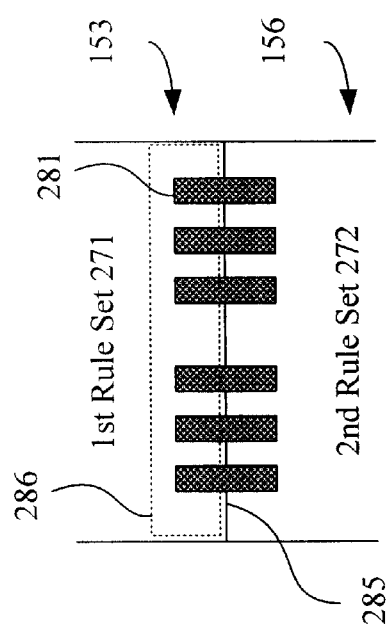

Assuming that phase shifting area 286 with the $2^{nd}$ rule set results in the number of phase conflicts being less than or equal to limit X(N), FIG. 2H illustrates that the non-phase conflict portions of area 286 can be phase shifted with the $2^{nd}$ rule set 272. An attempt can be made to apply $3^{rd}$ rule set 273 to the phase conflict portions of area 286. If phase conflicts 281 are eliminated using $3^{rd}$ rule set 273, then that rule set can be used for those phase conflicts areas. If phase conflicts 281 are still present using $3^{rd}$ rule set 273, then each phase conflict area can be treated independently (two conflict areas shown, each conflict area having two phase conflicts). Thus, as previously noted, one phase conflict area could be phase shifted with a $4^{th}$ rule set and the other phase conflict area could be phase shifted with a $5^{th}$ rule set, for example. Note that other portions of cell 153, i.e. those portions excluding area 286, remain phase shifted using $1^{st}$ rule set 271.

Note that other embodiments of the invention need not determine whether different rule sets are applied to the cells (i.e. step 233 could be eliminated). In such embodiments, either steps 234–240 (FIG. 2C) or steps 241–248 could be used to resolve any inter-cell phase conflicts.

In accordance with one embodiment, each parameter in the rule set can have a priority, a range, and/or an interval. The priority indicates the order in which parameter values should be modified. In one case, the parameter having the highest priority is modified last. The range indicates a range of values that a parameter can have. The interval indicates the differential when a parameter value is modified, e.g. by n nm increments.

In one embodiment, the user can be prompted to input priorities, ranges, and intervals, e.g. from a computer, a file stored on a computer, a file stored on a network, etc. In another embodiment, the user can select certain priorities, ranges, and intervals, e.g. after loading a set of parameters from a file or other sources. In yet another embodiment, the tool can provide default priorities, ranges, and intervals. Advantageously, once parameters, priorities, ranges, and intervals are input/set, corresponding rule sets can be automatically generated, as described below.

Figure 3A:
FIG. 3A illustrates an exemplary parameter table including three parameters and their associated priorities, ranges, and intervals.

FIG. 3A illustrates an exemplary table 300 including three parameters and their associated priorities, ranges, and intervals. Specifically, in table 300, a shifter width parameter has a "1" (i.e. highest) priority, a range of 500 nm down to 400 nm and an interval of 100 nm. An endcap margin parameter has a "2" (i.e. second highest) priority, a range of 250 nm down to 200 nm and an interval of 50 nm. A fieldcap margin parameter has a "3" (i.e. third highest) priority, a range of 200 nm down to 100 nm and an interval of 100 nm.

The table of FIG. 3A indicates that a user prefers shifters to be 500 nm wide when possible. However, shifters as little as 400 nm are acceptable for a given process. Notice also that a relatively large interval, 100 nm, was used. This is a stylistic preference to reduce the number of rule sets in the example to a manageable number for discussion. Smaller intervals will generate a greater number of rule sets.

In some embodiments, the parameters are prioritized based on their effect on printing resolution. For example, shifter width typically has the greater effect on print quality and/or yield. For example, shifter width typically may have a greater effect on print quality compared to either of endcap margin and fieldcap margin. Therefore, the shifter width can be given a higher priority than the endcap margin and the fieldcap margin. Similar reasoning may have lead to the prioritization of the endcap margin over the fieldcap margin. Additional parameters affecting shifter placement may be available in different embodiments.

Figure 3B:
FIG. 3B illustrates a rule set table corresponding to the information provided in the parameter table of FIG. 3A.

FIG. 3B illustrates a rule set table 310 automatically generated from the information provided in table 300 (FIG. 3A). In rule set table 310, the most aggressive rule set, i.e. the $1^{st}$ rule set, the shifter width is 500 nm, the endcap margin is 250 nm, and the fieldcap margin is 200 nm. Parameter values in less aggressive rule sets are modified based on the priority of the parameter. For example, in the $2^{nd}$ rule set, the fieldcap margin is set to its less optimal value because of its associated priority of "3". In the $3^{rd}$ rule set, the endcap margin is set to its less optimal value, whereas the fieldcap margin is set again to its more optimal value. In the $5^{th}$ rule set, the shifter width is set to its less optimal value, whereas both the endcap margin and the fieldcap margin are set again to their more optimal values. In the $7^{th}$ rule set (i.e. the least aggressive rule set), the shifter width, the endcap margin, and the fieldcap margin are all set to their less optimal values.

A mask fabricated using different rule sets can include different endcap margins, fieldcap margins, or shifter widths within a single predefined (e.g. rectangular) area of the mask. A wafer fabricated with a mask exhibiting such varied parameters could include transistor gates having different endcap margins, fieldcap margins, and lengths, all gates being within an area of the wafer corresponding to the predefined area of the mask. Advantageously, this wafer provides enhanced lithographic performance. Specifically, allowing the application of multiple rule sets in a cell of the layout can optimize the resolution of the printed features on the wafer defined by that cell. Obtaining the best possible resolution for the printed features can provide a corresponding improvement in yield and process latitude for the wafer.

Figure 4:
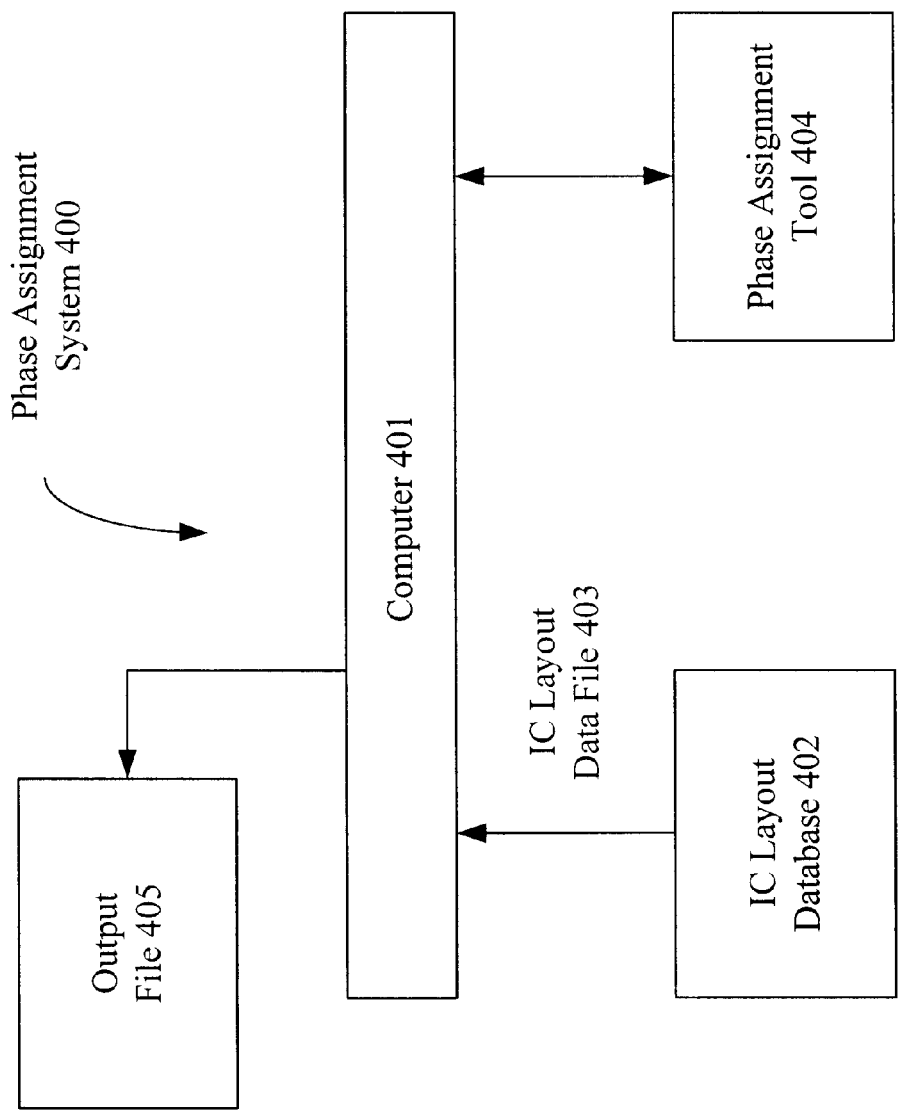
FIG. 4 illustrates a phase assignment system including a computer, an IC layout database, and a phase assignment tool.

FIG. 4 illustrates a phase assignment system 400 that includes at least one computer 401. Computer 401 could comprise a personal computer (PC) running with a microprocessor, either stand alone or connected to a network. Alternatively, computer 401 could comprise a workstation, such as a Sun™ workstation. More generally computer 401 represents one or more computers coupled in communication with processing capabilities.

Phase assignment system 400 can further include an IC layout database 402, which may be located physically apart from other components of phase assignment system 400. IC layout database 402 can provide a centralized storage area for IC layout data files. In one embodiment, computer 401 may access IC layout database 402 for files to be processed for phase shifting assignment through a local area network (LAN). In another embodiment, computer 401 may access IC layout database 402 though a wide area network (WAN), such as the Internet.

IC layout database 402 can include any one of several types of databases. For example, in a typical mask fabrication process, an engineer designs the mask layout in GDS-II format and sends this layout to a mask shop. The mask shop can use a CATS™ tool, licensed by Numerical Technologies, Inc., to receive the GDS-II file, break the geometries of the GDS-II file into the geometries that a mask fabrication machine can use (a process commonly called "fracturing"), and output a MEBES (or another vendor specific mask fabrication format) file. Thus, IC layout database 402 could include one or more GDS-II files and/or MEBES files. However, any layout database including design geometry information from the mask being assigned shifters could provide IC layout data file 403.

Computer 401 sends IC layout data file 403 to a phase assignment tool 404. In one implementation, phase assignment tool 404 can comprise the iN-Phase™ tool, licensed by Numerical Technologies, Inc., to implement the methodology described in reference to FIGS. 2A–2D. Phase assignment tool 404 determines the timing of and generates the information in an output file 405, which is output by computer 401. Output file 405 can include information regarding a binary mask and/or a PSM mask. Output file 405 can include GDS-II data or other standard data files. Other information, such as information indicating the rule sets used in the PSM mask and their locations, can also be provided in output file 405.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. For example, although the number of phase conflicts can be used to determine whether masking is appropriate, a percentage can also be used. In one embodiment, this percentage could be 60%. In another example, shifter length can be shortened for consecutive lower rule sets. A shorter shifter length could be used to resolve the inter-cell phase conflicts in FIG. 1A (i.e. between shifters 192/195 and 193/196). In yet another example, if masking and applying lower rule sets fails to resolve all phase conflicts, then other automatic modifications to the layout can be made. For example, U.S. patent application Ser. No. 09/823,380-7393, filed on Mar. 29, 2001, entitled "Incrementally Resolved Phase-Shift Conflicts in Layouts for Phase-Shifted Features", and incorporated by reference herein, describes breaking links between interacting shifters. Finally, the system and methods described herein can be applied to any lithographic process technologies, including ultraviolet, deep ultraviolet (DUV), extreme ultraviolet (EUV), x-ray, and ebeam. Accordingly, it is intended that the scope of the invention be defined by the following claims and their equivalents.

What is claimed is:

1. A method of automatically applying phase shifting rule sets to a layout, the method comprising:

receiving an ordered sequence of phase shifting rule sets, each of the phase shifting rule sets differing in terms of the relative aggressiveness of a level of phase shifting generated from parameters specified by the rule sets;

receiving a layout, the layout comprising a plurality of cells;

applying a first phase shifting rule set in the ordered sequence in a first cell in the plurality of cells;

determining a number of phase conflicts in the first cell caused by applying the first phase shifting rule set; and based on determining the number of phase conflicts, phase shifting portions of the first cell with no phase conflicts using the first phase shifting rule set and further processing portions of the first cell with phase conflicts using remaining phase shifting rule sets in the ordered sequence.

2. The method of claim 1, wherein the cells are determined from at least one of a layout format and a layout geometry.

3. The method of claim 1, wherein determining the number of phase conflicts includes comparing the number of phase conflicts against a predetermined limit.

4. The method of claim 3, wherein the predetermined limit is associated with the applied first phase shifting rule set.

5. The method of claim 1, wherein further processing includes recursively trying successive phase shifting rule sets in the ordered sequence within each area of the first cell having phase conflicts.

6. The method of claim 1, wherein the steps of applying, determining, and phase shifting are performed on at least a second cell in the layout, the second cell being adjacent to first cell, the method further including:

identifying any inter-cell phase conflicts; and resolving the inter-cell phase conflicts.

7. The method of claim 6, wherein resolving the inter-cell phase conflicts includes determining whether a same phase shifting rule set is applied to the first and second cells.

8. The method of claim 7, wherein if the same phase shifting rule set is applied and based on a number of inter-cell phase conflicts, then phase shifting shared edge portions of the first and second cells with no phase conflicts using a less aggressive phase shifting rule set than the same phase shifting rule set and further processing shared edge portions of the first and second cells with phase conflicts using remaining phase shifting rule sets in the ordered sequence.

9. The method of claim 7, wherein if a different phase shifting rule set is applied and based on a number of inter-cell phase conflicts, then phase shifting shared edge portions of one of the first and second cells, whichever cell with a more aggressive rule set, using a next phase shifting rule set in the ordered sequence.

10. A method for manufacturing an integrated circuit, the method comprising:

forming a phase shifting mask based on a layout for the integrated circuit, wherein forming the phase shifting mask includes:

receiving an ordered sequence of phase shifting rule sets, each of the phase shifting rule sets differing in terms of the relative aggressiveness of a level of phase shifting generated from parameters specified by the rule sets;

receiving the layout, which includes a plurality of cells;

applying a first phase shifting rule set in the ordered sequence in a first cell;

determining a number of phase conflicts in the first cell caused by applying the first phase shifting rule set; and based on determining the number of phase conflicts, phase shifting portions of the first cell with no phase conflicts using the first phase shifting rule set and further processing portions of the first cell with phase conflicts using remaining phase shifting rule sets in the ordered sequence;

forming a complementary mask based on the layout for the integrated circuit; and exposing the phase shifting mask and the complementary mask.

11. The method of claim 10, wherein determining the number of phase conflicts includes comparing the number of phase conflicts against a predetermined limit.

12. The method of claim 11, wherein the predetermined limit is associated with the applied first phase shifting rule set.

13. The method of claim 10, wherein further processing includes recursively trying successive phase shifting rule sets in the ordered sequence within each area of the first cell having phase conflicts.

14. The method of claim 10, wherein the steps of applying, determining, and phase shifting are performed on at least a second cell in the layout, the second cell being adjacent to first cell, wherein forming the phase shifting mask further includes:

identifying any inter-cell phase conflicts; and resolving the inter-cell phase conflicts.

15. A system of providing phase assignment, the system comprising:

a computer; and a tool running on the computer, the tool including means for receiving an ordered sequence of phase shifting rule sets, each of the phase shifting rule sets differing in terms of the relative aggressiveness of a level of phase shifting generated from parameters specified by the rule sets;

means for receiving a layout, the layout comprising a plurality of cells;

means for applying a first phase shifting rule set in the ordered sequence in a first cell;

means for determining a number of phase conflicts in the first cell caused by applying the first phase shifting rule set; and means for phase shifting portions of the first cell with no phase conflicts using the first phase shifting rule set and further processing portions of the first cell with phase conflicts using remaining phase shifting rule sets in the ordered sequence, wherein the means for phase shifting is responsive to the means for determining.

16. The system of claim 15, further including:

means for detecting at least one inter-cell phase conflict at a shared edge of the first cell and a second cell; and means for resolving the at least one inter-cell phase conflict.

17. A computer program product comprising:

a computer usable medium having a computer readable program code embodied therein for causing a computer to automatically modify a layout including phase assignment, the computer readable program code comprising:

computer readable program code for receiving an ordered sequence of phase shifting rule sets, each of the phase shifting rule sets differing in terms of the relative aggressiveness of a level of phase shifting generated from parameters specified by the rule sets;

computer readable program code for receiving a layout, the layout comprising a plurality of cells;

computer readable program code for applying a first phase shifting rule set in the ordered sequence in a first cell;

computer readable program code for determining a number of phase conflicts in the first cell caused by applying the first phase shifting rule set; and computer readable program code for phase shifting portions of the first cell with no phase conflicts using the first phase shifting rule set and further processing portions of the first cell with phase conflicts using remaining phase shifting rule sets in the ordered sequence, wherein the computer readable program code for phase shifting is responsive to the computer readable program code for determining.

18. The computer program product of claim 17, wherein the computer readable program code for determining the number of phase conflicts includes computer readable program code for comparing the number of phase conflicts against a predetermined limit.

19. The computer program product of claim 17, wherein the computer readable program code for phase shifting further includes computer readable program code for recursively trying successive phase shifting rule sets in the ordered sequence within each area of the first cell having phase conflicts.

20. The computer program product of claim 17, further including:

computer readable program code for identifying any inter-cell phase conflicts between the first cell and a second cell adjacent the first cell; and computer readable program code for resolving the inter-cell phase conflicts.

21. The computer program product of claim 20, wherein the computer readable program code for resolving the inter-cell phase conflicts includes computer readable program code for determining whether a same phase shifting rule set is applied to the first and second cells.

22. The computer program product of claim 21, wherein computer readable program code for determining whether the same rule set is applied includes computer readable program code for phase shifting shared edge portion of at least one of the first and second cells.

* * * * *